United States Patent
Asao et al.

(10) Patent No.: US 7,033,043 B2
(45) Date of Patent: Apr. 25, 2006

(54) VEHICLE LIGHTING DEVICE AND METHOD OF ASSEMBLING A VEHICLE LIGHTING DEVICE

(75) Inventors: Kazuhiro Asao, Yokkaichi (JP); Takashi Niwa, Yokkaichi (JP); Takashi Kitade, Yokkaichi (JP)

(73) Assignee: Sumitomo Wiring Systems, Ltd., (JP)

( * ) Notice: Subject to any disclaimer, the term of this patent is extended or adjusted under 35 U.S.C. 154(b) by 121 days.

(21) Appl. No.: 10/855,173

(22) Filed: May 27, 2004

(65) Prior Publication Data

US 2004/0240227 A1   Dec. 2, 2004

(30) Foreign Application Priority Data

May 29, 2003   (JP)   .............................. 2003-152724

(51) Int. Cl.
*H05B 37/00*   (2006.01)

(52) U.S. Cl. ..................... 362/240; 362/227; 362/630; 362/612; 362/378; 362/441; 315/77; 315/58; 315/294; 315/312; 307/9.1; 307/10.8

(58) Field of Classification Search .................. 362/27, 362/29, 221, 240, 227, 441, 555, 612, 630, 362/800, 378, 250; 315/77, 58, 294, 312, 315/200 A, 325; 307/9.1, 10.1, 10.8; 340/815.45
See application file for complete search history.

(56) References Cited

U.S. PATENT DOCUMENTS

| | | | | |
|---|---|---|---|---|
| 4,023,887 | A * | 5/1977 | Speers | 385/50 |
| 5,577,832 | A * | 11/1996 | Lodhie | 362/249 |
| 6,346,777 | B1 * | 2/2002 | Kim | 315/185 S |
| 2002/0117692 | A1 * | 8/2002 | Lin | 257/235 |
| 2004/0105264 | A1 * | 6/2004 | Spero | 362/276 |
| 2004/0156213 | A1 * | 8/2004 | Lodhie | 362/555 |

FOREIGN PATENT DOCUMENTS

JP   2001-294079   10/2001

* cited by examiner

*Primary Examiner*—Haissa Philogene
(74) *Attorney, Agent, or Firm*—Gerald E. Hespos; Anthony J. Casella

(57) ABSTRACT

LEDs (10) are used as a tail stop lamp (L1). A socket (21) for the LEDs (10) is provided at the left end of a socket base (20), and a lighting circuit (15) for the LEDs (10) including the socket (21) and a connector portion (25) is constructed on the socket base (20). Thus, electronic parts, such as resistors for luminance adjustment, are formed into control modules (30) by molding. Lead terminals (32) of the respective control modules (30) are formed by insulation-displacement terminals. On the other hand, insulated wires (40) are laid through mount bases (35) in a specified circuit pattern on the socket base (20). When the control modules (30) are mounted into the corresponding mount bases (35), the lead terminals (32) are pressed into connection to form the lighting circuit.

10 Claims, 10 Drawing Sheets

VEHICLE LIGHTING DEVICE AND METHOD OF ASSEMBLING A VEHICLE LIGHTING DEVICE

BACKGROUND OF THE INVENTION

1. Field of the Invention

The invention relates to a vehicle lighting device that uses a light emitting element, such as a light emitting diode, as a light source.

2. Description of Related Art

Japanese Unexamined Patent Publication No. 2001-294079 is an example of several recent proposals to use light emitting diodes (LEDs) as light sources for some vehicle lighting devices in place of electric bulbs, such as base bulbs or wedge base bulbs. However, LEDs require lighting circuits with resistors and diodes for luminance control and protection. Accordingly, a printed circuit board has been required for lighting circuits of LEDs.

The resistors and diodes have been soldered to the circuit pattern of the lighting circuits on the printed circuit board of the prior art vehicle lighting device and this operation is cumbersome. The luminance of the LED can be adjusted, for example, by changing the capacity of the resistor (resistance value). However, changing the soldered resistors is not easy. Thus, the luminance generally is not adjusted. Further, there are several other problems including the tendency of the printed circuit board to take up a large space. Thus, there is earnest demand for further improvements.

The present invention was developed in view of the above problems and an object is to decrease production costs for such vehicle lighting devices.

SUMMARY OF THE INVENTION

The invention relates to a vehicle lighting device with a light emitting element as a light source. Power is applied to the light emitting element via a lighting circuit with at least one control electronic or electric part, such as a resistor, a diode and the like. The vehicle lighting device has a base with at least one socket into which the light emitting element is mountable. At least one insulated wire is laid to form a specified circuit pattern and is connected with the socket. At least one control module preferably is formed by resin-molding the electronic and/or electric parts. At least one connection terminal projects from control module and is disposed for connection with insulated wires at specified positions of the insulated wires by insulation displacement means of the connection terminals to form the lighting circuit.

The lighting circuit is formed merely by pressing the control module into connection with the laid insulated wires. Thus, the lighting circuit is formed easily and the device is produced easily. Luminance of the light emitting element can be adjusted merely by changing the number of connections of the control modules for one electric or electronic property (e.g. resistors) and changing another electric or electronic property (e.g. the capacity thereof). This makes a printed circuit board unnecessary and reduces space. Additionally, the circuit pattern and the connecting positions of the control modules can be changed easily, thereby improving freedom in designing the lighting circuit and facilitating specification changes.

The connection terminal of each control module may project in a mounting direction from a side surface of a main body. Accordingly, the height of the control module is less than the height of a control module in which a connection terminal projects from the bottom or mating surface of a main body. Thus, the height of the lighting device can be reduced.

A socket preferably is provided on the base for receiving at least one LED and/or at least one electric bulb. Thus, a change in the entire construction can be accommodated even if the light emitting element is used only for some of a plurality of light sources, as in a combination lamp.

The connection terminal preferably comprises at least one blade for cutting and/or displacing an insulation coating of the insulated wire.

At least one mount base preferably is provided on the base for mounting the control module.

The invention also relates to a method for assembling a vehicle lighting device. The method comprises providing a base with a socket into which a light emitting element is mountable. The method also comprises laying insulated wires to form a circuit pattern for connection with the socket on the base. The method then includes arranging at least one control module having one or more insulation-displacement connection terminals projecting therefrom and connecting the control modules with the insulated wires at specified positions by insulation displacement to form the lighting circuit.

The method may also comprise forming the control modules by resin-molding electronic and/or electric parts, such as a resistor, a diode or the like.

Each control module preferably is formed so that the connection terminal projects in a mounting direction from a side surface of a main body.

The method may further comprise providing a socket on the base for receiving at least one LED and/or at least one electric bulb.

The method also may comprise providing one or more mount bases on the base for mounting the control module.

These and other features of the invention will become more apparent upon reading the following detailed description and accompanying drawings. It should be understood that even though embodiments are described separately, single features thereof may be combined to additional embodiments.

DETAILED DESCRIPTION OF THE PREFERRED EMBODIMENTS

A first embodiment of the invention is illustrated in FIGS. 1 to 7, and relates to a rear combination lamp to be disposed at a rear part of a vehicle. The rear combination lamp shown in FIG. 1 has: a tail stop lamp L1, which also serves as a side lamp, that turns on upon a braking operation; a backup lamp L2 that turns on when the vehicle is shifted into reverse; and a rear turn signal lamp L3. The lamps L1–L3 are arranged substantially in a row while being spaced apart. Light emitting diodes 10 (hereinafter, LED) are used in the tail stop lamp L1, and bulbs 11 are used in the backup lamp L2 and the rear turn signal lamp L3.

Figure 3:
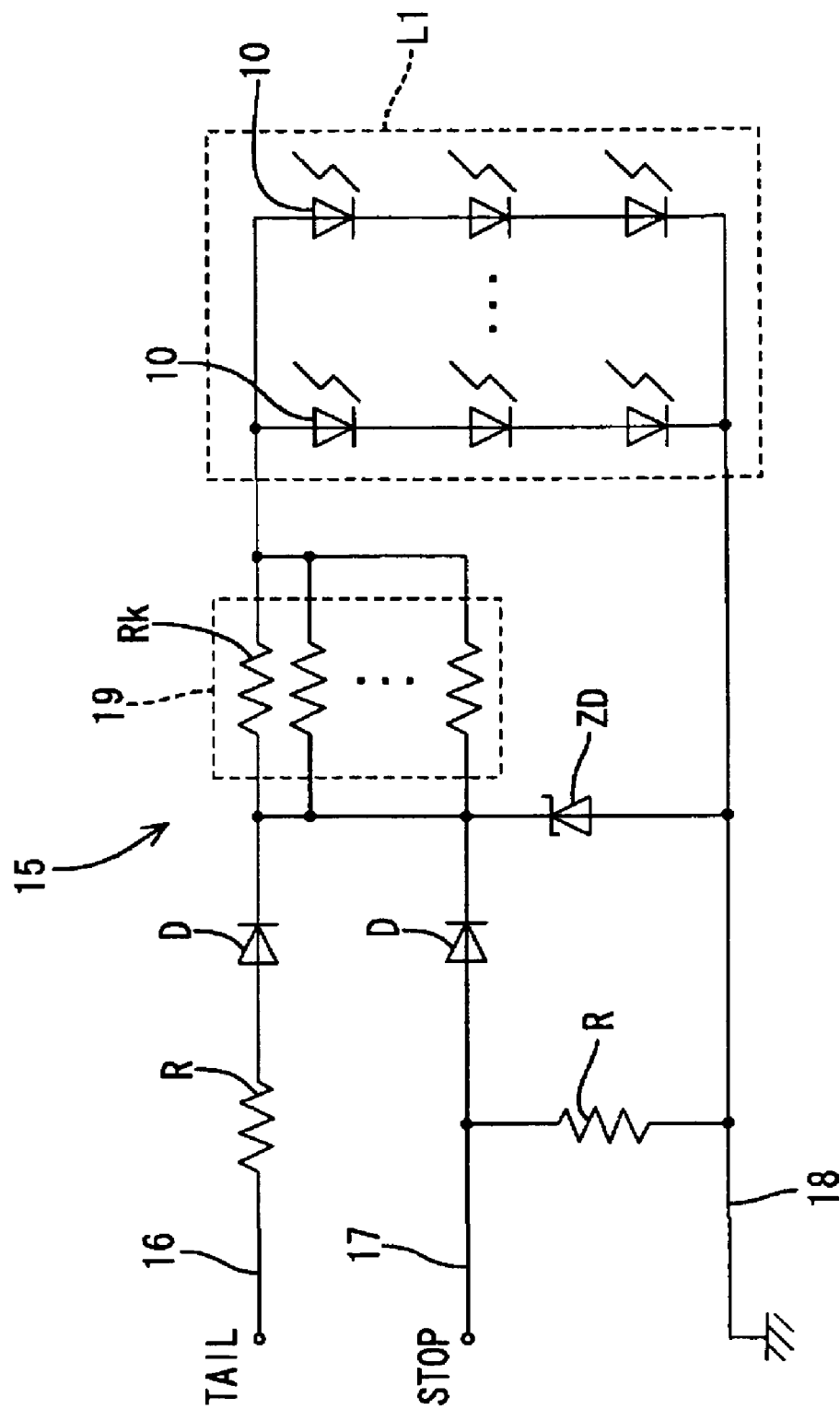
FIG. 3 is a circuit construction diagram of a lighting circuit.

LEDs 10 are used in the tail stop lamp L1 and a lighting circuit 15 is provided therefor as shown in FIG. 3. It should be noted that the number of the LEDs 10 can be varied from this illustrated embodiment.

The lighting circuit 15 has a tail-side input line 16 and a stop-side input line 17. The LEDs 10 are connected between the input lines 16, 17 and a ground line 18, and a luminance adjuster 19 including resistors Rk for luminance adjustment are provided in the lighting circuit 15. Diodes D and a zener diode ZD are connected at specified positions for protection or other purposes.

A current of a specified value is constantly applied to the tail-side input line 16, for example, at night. As a result, the LEDs 10 are turned on at a relatively low luminance to function as a tail lamp. A current with a value several times as large as the current applied to the tail-side input line 16 is applied to the stop-side input line 17 if braking is applied while the LEDs 10 are on. Thus, the LEDs 10 are turned on at a high luminance and function as a stop lamp. Here, the luminance of the LEDs 10 can be adjusted by the total resistance value of the resistors Rk in the luminance adjuster 19.

Figure 1:
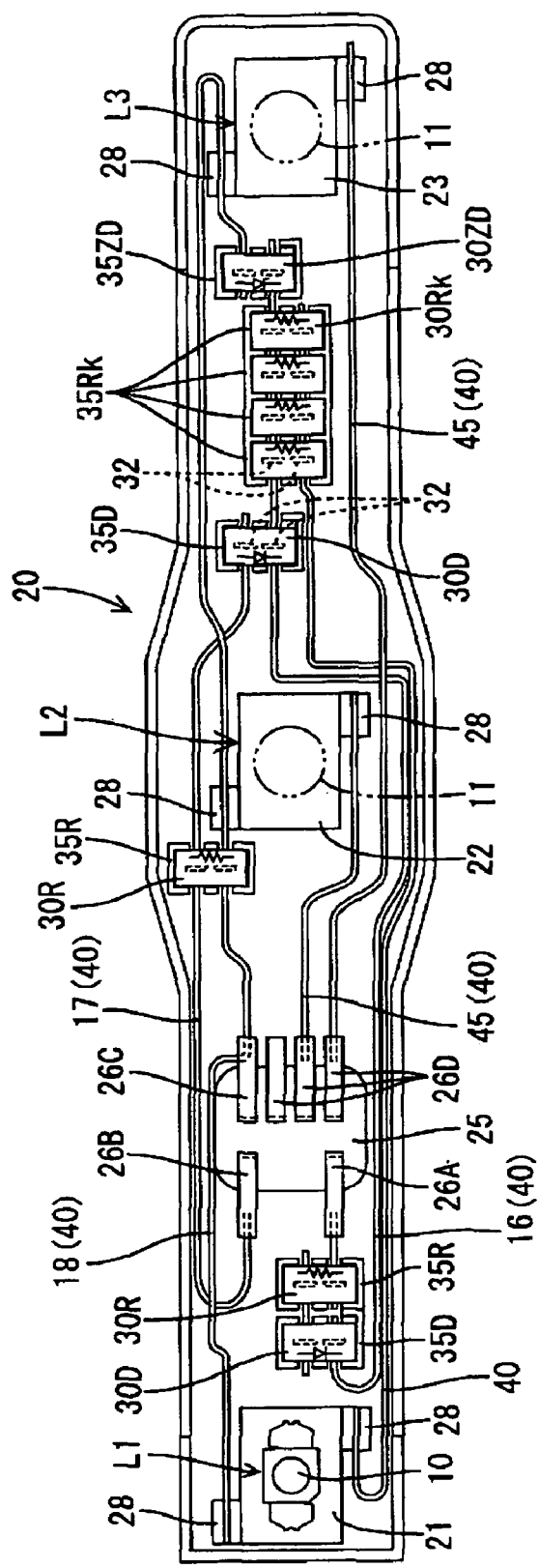
FIG. 1 is a plan view of a combination lamp according to a first embodiment of the invention.
Figure 2:
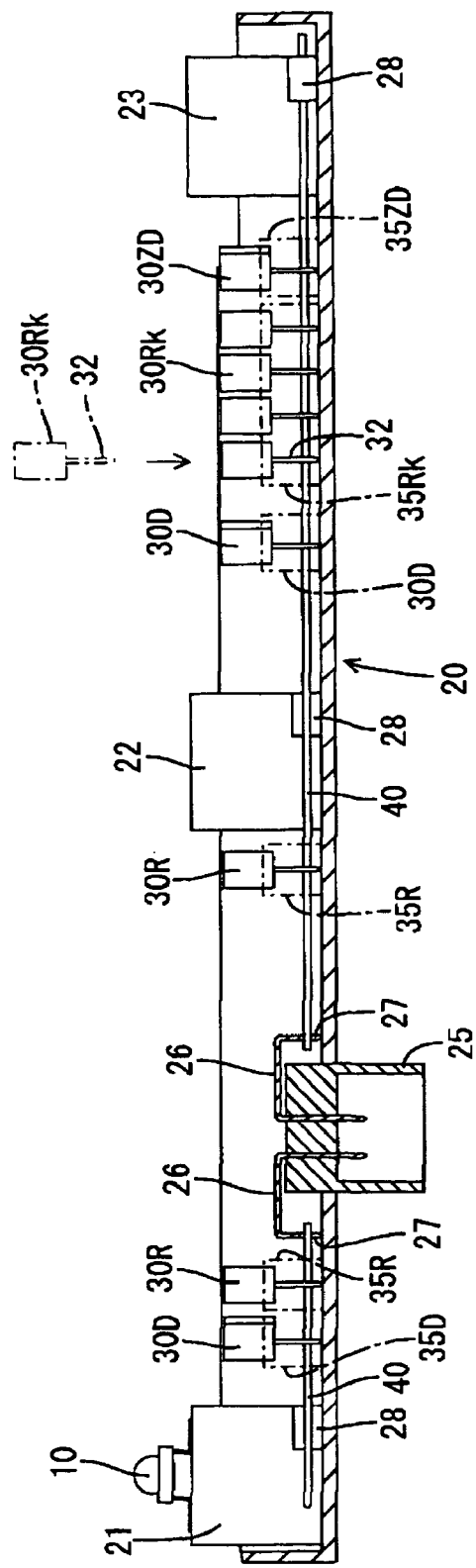
FIG. 2 is a side view in section of the combination lamp.

The lighting device includes a socket base 20 made e.g. of a synthetic resin and in the form of a shallow and narrow saucer, as shown in FIGS. 1 and 2. The socket base 20 is formed with a first socket 21 to mount the LEDs 10 as the tail stop lamp L1, and second and third sockets 22, 23 to mount the bulb 11 as the backup lamp L2 and the bulb 11 as the rear turn signal lamp L3 in this order from the left side.

A connector 25 is provided between the first and second sockets 21, 22 and has an open bottom for receiving a connector of an unillustrated power-supply. A tail-side input terminal 26A and a stop-side input terminal 26B are mounted at one side of the connector 25, and a ground terminal 26C and other (e.g. three) input terminals 26D are mounted at the other side. One end of each terminal 26 is located in an opening of the connector 25, as shown in FIG. 2. Further, at least one blade 27 is formed at the other end of each terminal 26.

Figure 4:
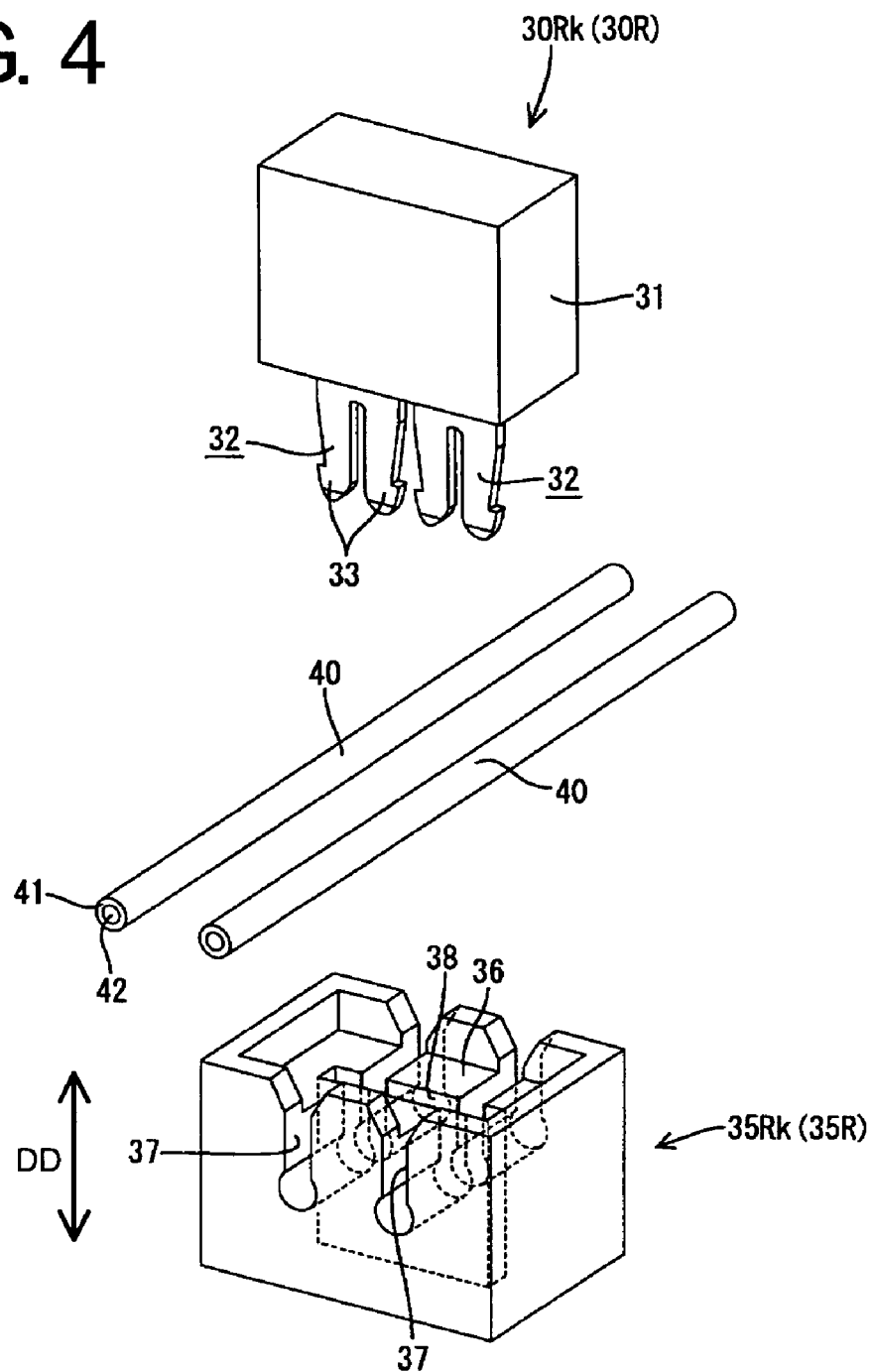
FIG. 4 is an exploded perspective view showing a resistor module and a connecting construction therefore.

The resistors Rk for luminance adjustment, the resistors R, the diodes D and the zener diode ZD for protection or other purpose are formed into modules in the lighting circuit 15. For example, the resistors Rk for luminance adjustment are embedded in main bodies 31 by molding, as shown in FIG. 4, to form resistor modules 30Rk for luminance adjustment. Two insulation-displacement terminals 32 project substantially side by side from the bottom surface of the main body 31 of each resistor module 30Rk, and are formed with blades 33.

Similarly, the resistors R, the diodes D and the zener diode ZD for protection or other purpose are formed into resistor modules 30R, diode modules 30D, and a zener diode module 30ZD by molding, and a pair of insulation-displacement terminals 32 project from the bottom surface of each main body 31.

Figure 5:
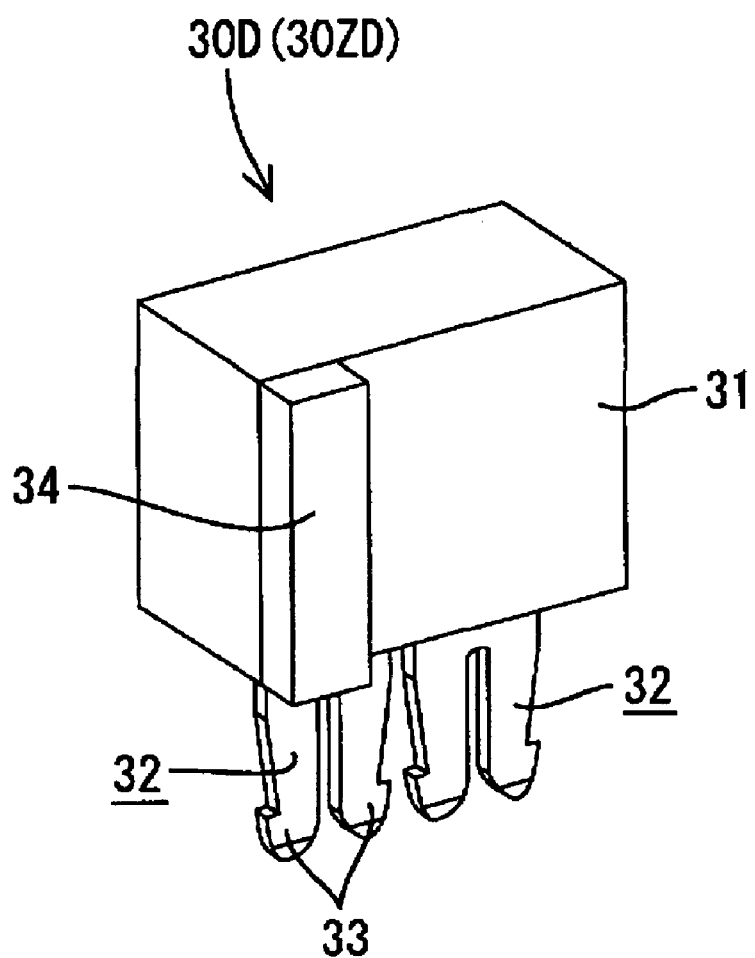
FIG. 5 is a perspective view of a diode module.

A positioning rib 34 is formed at an end of one surface of each main body 31 in the diode modules 30D and the zener diode module 30ZD, as shown in FIG. 5, to stabilize an inserting posture into a mount base 35. The respective modules 30Rk, 30R, 30D and 30ZD are referred to collectively herein as control modules 30.

Mount bases 35Rk are formed substantially side-by-side between the second socket 22 and the third socket 23 in the socket base 20 into which the resistor modules 30Rk for luminance adjustment are to be mounted. A mount base 35D for the diode module 30D and a mount base 35ZD for the zener diode module 30ZD are formed at the left and right sides of the mount bases 35Rk. Further, a mount base 35R for the resistor module 30R is formed at the left side of the second socket 22, and the mount base 35D for the diode module 30D and the mount base 35R for the resistor module 30R are formed substantially side by side at the right side of the first socket 21.

Figure 6:
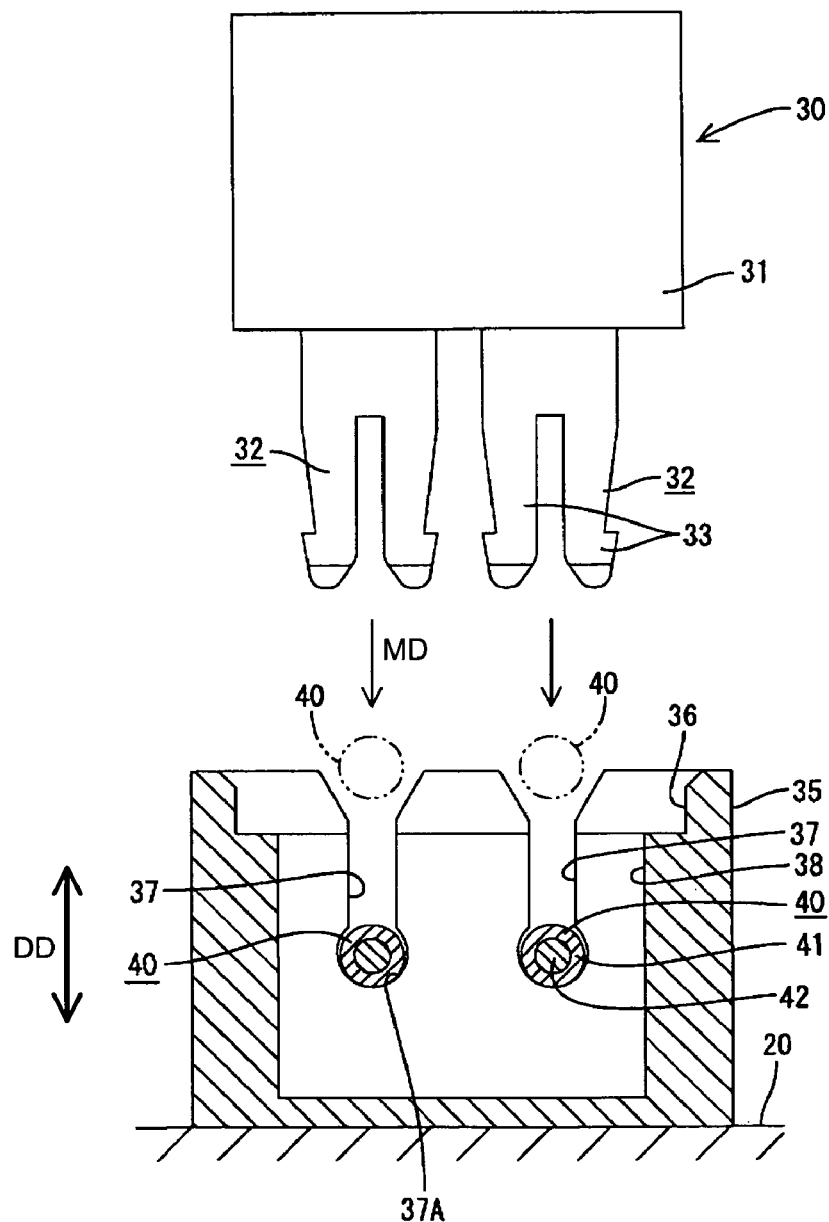
FIG. 6 is a section showing an operation of pressing a control module into contact.

As shown in FIGS. 4 and 6, an engaging recess 36 is formed in the upper mating surface of each mount base 35 for receiving the bottom end of the main body 31 of the control module 30, and two parallel accommodating grooves 37 extend between two longer surfaces for receiving insulated wires 40. The accommodating grooves 37 extend from the upper surface to an intermediate position with respect to a depth direction DD, and the insulated wires 40 are accommodated in bottom portions 37A so as not to come out, as shown in FIG. 6. The bottom portions 37a are slightly wider than an inserting side of the accommodating groove 37 (see e.g. FIG. 6) so that the insulated wire 40 can be held securely therein. An insertion groove 38 is formed substantially normal to the accommodating grooves 37 in an intermediate portion for receiving the lead terminals 32 of the control module 30.

Each of the first, second and third sockets 21, 22, 23 has a pair of connecting portions 28 substantially on the opposite surfaces thereof. Although not shown in detail, insulation-displacement terminals connected with the mounted LEDs 10 or bulb 11 are accommodated in the connecting portions 28, and the insulated wires 40 are inserted into the insulation-displacement terminals to be electrically connected therewith.

The lighting circuit 15 is formed by initially preparing the insulated wires 40 having lengths corresponding to the tail-side input line 16, the stop-side input line 17, the ground line 18, and other necessary connecting lines. As shown in FIG. 1, the insulated wires 40 are laid in a specific circuit pattern from the first socket 21 and the respective mount bases 35 to the connector 25. The insulated wires 40 to be connected with the first socket 21 are pressed into the connecting portions 28 for connection with the insulation-displacement terminals. Ends of the insulated wire 40 that forms the tail-side input line 16 and the insulated wire 40 that forms the stop-side input line 17 are connected respectively with the tail-side input terminal 26A and the stop-side input terminal 26B. The insulated wire 40 that forms the ground line 18 is connected with the ground terminal 26C at its intermediate position by insulation displacement.

Further, the insulated wires 40 laid in the respective mount bases 35 are pushed into the accommodating grooves 37 for accommodation in the bottom portions 37A, as shown in FIG. 6.

Figure 7:
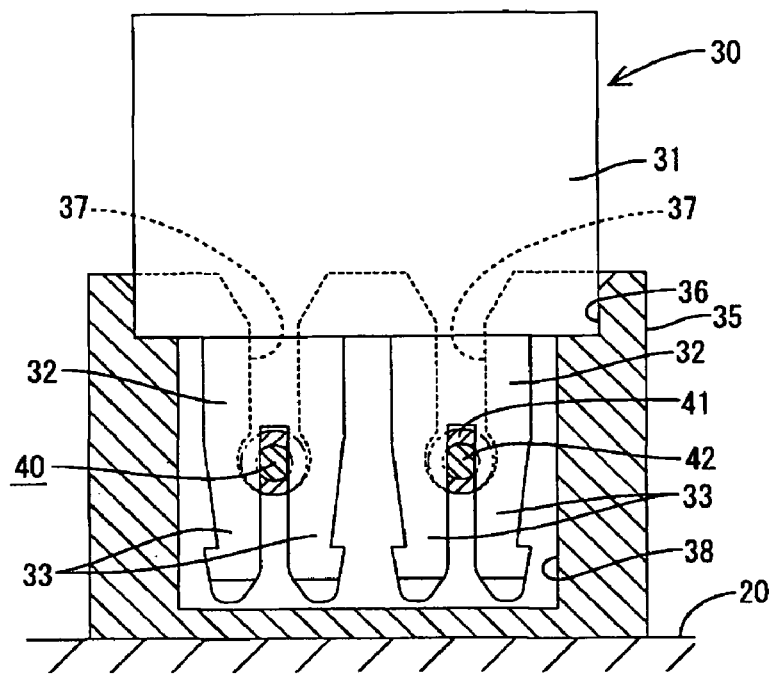
FIG. 7 is a section showing a state after the operation of FIG. 6 is completed.

The control modules 30 are mounted into the corresponding mount bases 35 after the insulated wires 40 are laid. The lead terminals 32 enter the insertion groove 38 when the control module 30 is mounted into the mount base 35 in a mounting direction MD (as indicated by arrows in FIG. 6). As a result, the blades 33 cut or displace the insulation coatings 41 of the insulated wires 40. The blades 33 contact the cores 42 of the insulated wires 40 when the control module 30 is mounted properly, as shown in FIG. 7. Thus, the respective lead terminals 32 of the control module 30 are connected electrically with the corresponding insulated wires 40 by insulation displacement.

The lighting circuit 15 is completed by mounting the LEDs 10 into the first socket 21. The LEDs 10 then can be turned on and off by fitting the connector connected with the power supply wire into the connector 25. Luminance of the LEDs 10 may be adjusted by changing the number of the resistor modules 30Rk for luminance adjustment or by preparing a plurality of kinds of resistor modules 30Rk in which the resistors Rk have different total resistance values and then mounting a selected resistor module 30Rk. In short, the luminance of the LEDs 10 can be adjusted by changing the total resistance value of the resistors Rk in the luminance adjuster 19.

The second and third sockets 22, 23 for the bulbs 11 are connected with the corresponding input terminals 26D via other connection lines 45 made of the insulated wires 40. The ground line 18 of the lighting circuit 15 for the LEDs 10 also is used as a ground line. Bulbs 11 mounted in the sockets 22, 23 also can be turned on and off as a result of connection with the connector connected with the power-supply wire.

The lighting circuit 15 for the LEDs 10 is prepared by using the control modules 30 having electronic or electric parts embedded therein. More particularly, the insulated wires 40 are laid in a specified circuit pattern and the control modules 30 are connected with the insulated wires 40 by insulation displacement as the control modules 30 are mounted into the corresponding mount bases 35. Thus, as compared to conventional cases where the electronic or electric parts are soldered, the lighting circuit 15 is formed more easily, which leads to the efficient production of a lighting device within a shorter period.

The control modules 30 are connected with the insulated wires 40 by insulation displacement. Thus, a change in the number of connection of the resistor modules 30Rk for luminance adjustment, a change in the capacity (resistance value) of the resistor modules 30Rk and/or other changes can be made easily, with the result that the luminance of the LEDs 10 can be adjusted.

Since the printed circuit board is not necessary, less space is used.

The circuit pattern is formed by laying the insulated wires 40 and connecting the control modules 30 by insulation displacement. Thus, the connecting positions of the circuit pattern and the control modules 30 can be changed easily, thereby improving a degree of freedom in designing the lighting circuit 15 and enabling a specification change to be dealt with easily.

The LEDs 10 can be used only for some light sources in combination lamp without changing the entire construction by, for example, forming the lighting circuit 15 in dead space on a socket base 20.

A second embodiment of the invention is described with reference to FIGS. 8 to 11. In the second embodiment, the shape of the control modules is changed. Only differences from the first embodiment are described below. Parts having similar functions as in the first embodiment are identified by the same reference numerals, but are not described.

Figure 8:
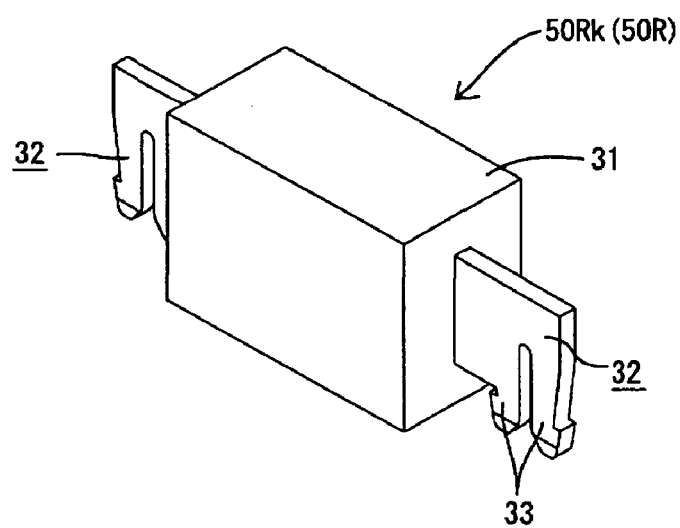
FIG. 8 is a perspective view of a resistor module according to a second embodiment.

The resistors Rk for luminance adjustment, the resistors R, the diodes D and/or the zener diode ZD for protection or other purpose in the lighting circuit 15 are formed into modules by molding. Each resistor module 50Rk for luminance adjustment and a resistor module 50R have two insulation-displacement terminals 32 with blades 33 that project down from substantially opposite side surfaces of a substantially block-shaped main body 31, as shown in FIG. 8.

Figure 9:
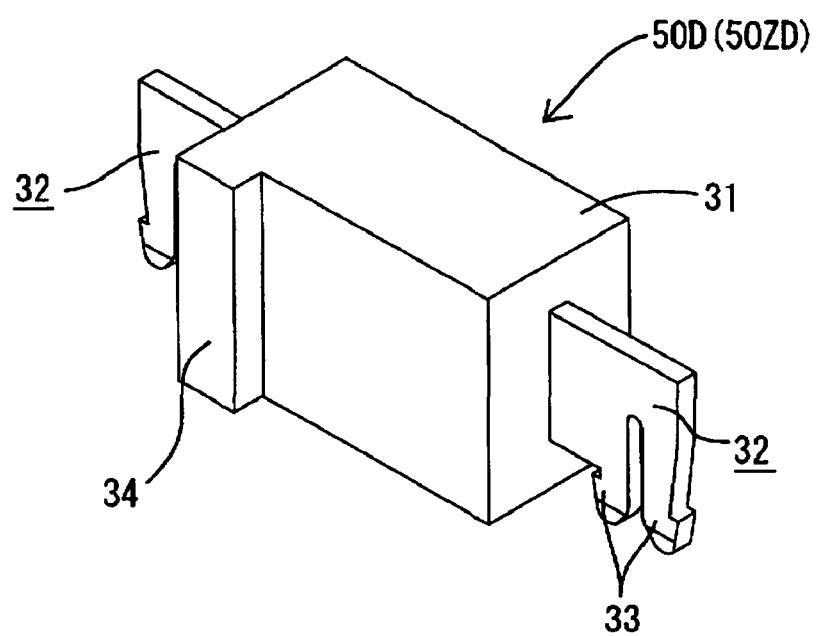
FIG. 9 is a perspective view of a diode module.

Each of diode modules 50D and a zener diode module 50ZD also is formed so that two insulation-displacement terminals 32 with blades 33 project down from the substantially opposite side surfaces of a main body 31, as shown in FIG. 9. However, in the diode modules 50 and the zener diode module 50ZD, a positioning rib 34 is formed at an end of one surface of the main body 31 to stabilize an inserting posture and/or guiding an insertion into a mount base 55 to be described later, as shown in FIG. 9. Thus, each control module 50 is a lateral control module having the terminals 32 on the substantially opposite side surfaces of the main body 31.

Figure 10:
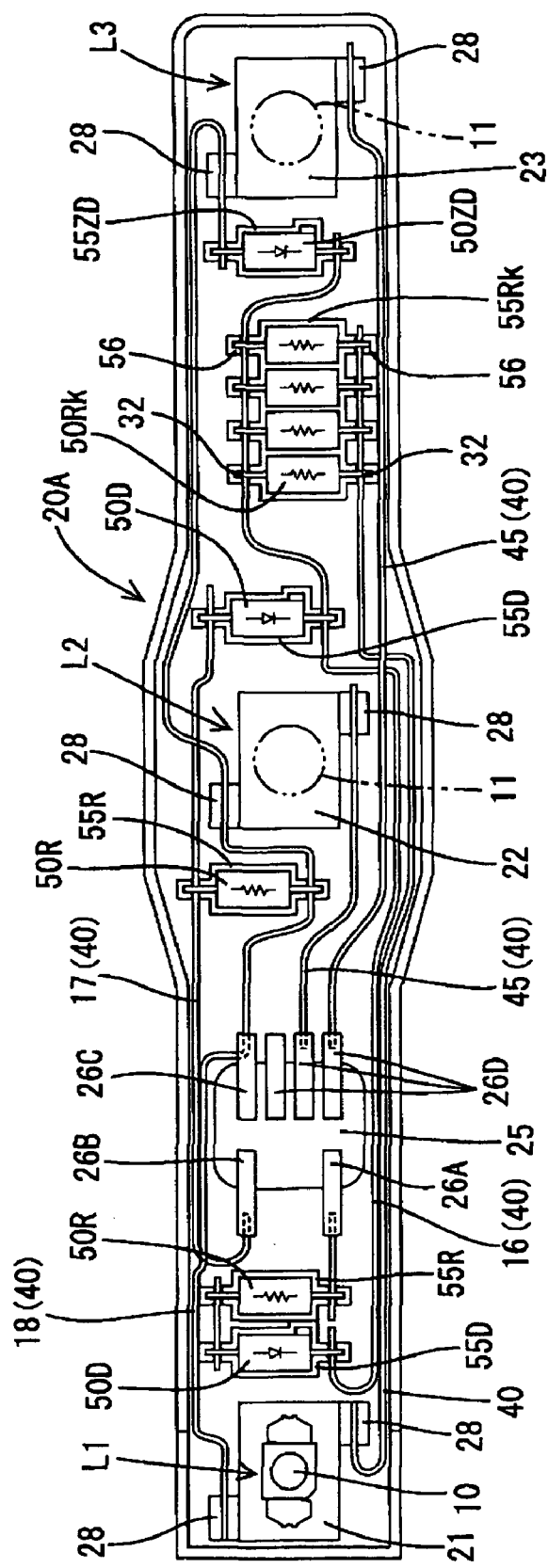
FIG. 10 is a plan view of a combination lamp.
Figure 11:
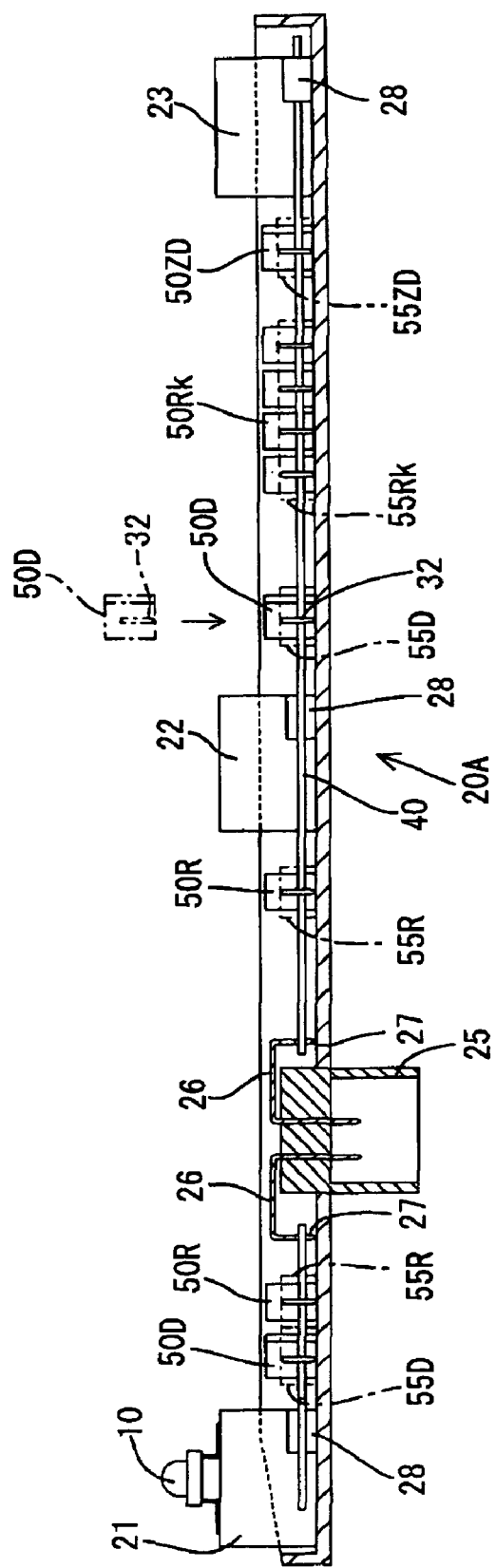
FIG. 11 is a side view in section of the combination lamp.

Mount bases 55Rk, 55R, 55D and 55ZD are formed on a socket base 20A, as shown in FIGS. 10 and 11, substantially in the same arrangement as in the first embodiment for receiving the respective control modules 50. Receiving portions 56 are formed on substantially opposite side surfaces of the mount base 55 of the second embodiment for receiving the insulated wires 40. Terminals 32 of the control module 50 then can be pressed into contact with the insulated wires 40.

In this second embodiment, the insulated wires 40 are laid in a specified circuit pattern from the first socket 21 and the respective mount bases 55 (receiving portions 56) to the connector 25, as shown in FIG. 10. Thereafter, the lead terminals 32 of the control modules 50 are inserted into the receiving portions 56 of the corresponding mount bases 55 for connection by insulation displacement with the insulated wires 40.

In the second embodiment as well, the same functions and effects as those of the first embodiment can be obtained. In addition, the control modules 55 are lateral type and have lead terminals 32 that project down from the side surfaces of the main body 31. Thus, the height of the control modules 50 and the height of the control modules 50 on the socket base 20A is small. As a result, the height of the entire combination lamp is made smaller.

The invention is not limited to the above described and illustrated embodiments. For example, the following embodiments are also embraced by the technical scope of the present invention as defined by the claims. Beside the following embodiments, various changes can be made without departing from the scope and spirit of the present invention as defined by the claims.

The assembling procedures shown in the foregoing embodiments are merely examples and can be suitably changed.

Although the LEDs are used only for one lamp of the rear combination lamp, they may be used for all the lamps.

The present invention is applicable not only to combination lamps, but also to vehicle lighting devices provided with a single lighting device.

What is claimed is:

1. A vehicle lighting device with a light emitting element (10; 11) as a light source and constructed so that power is applied to the light emitting element (10; 11) via a lighting circuit in which at least one control electronic part (Rk; R; D; ZD) is provided, comprising: a base (20; 20A) with at least one socket (21; 22; 23) for receiving the light emitting element (10; 11); at least one insulated wire (40) laid on the base (20; 20A) to form a specified circuit pattern and being connected with the socket (21; 22; 23); and control modules (30Rk; 30R; 30D; 30ZD; 50Rk; 50R; 50D; 50ZD) having at least one connection terminal (32) projecting therefrom, the connection terminals (32) being connected at specified positions with the insulated wires (40) by insulation displacement, thereby forming the lighting circuit.

2. The vehicle lighting device of claim 1, wherein the control modules (30Rk; 30R; 30D; 30ZD; 50Rk; 50R; 50D; 50ZD) are formed by resin-molding the electronic and/or electric parts (Rk; R; D; ZD).

3. The vehicle lighting device of claim 1, wherein each control module (30Rk; 30R; 30D; 30ZD; 50Rk; 50R; 50D; 50ZD) is formed such that the connection terminal (32) projects in a mounting direction (MD) from a side surface of a main body (31).

4. The vehicle lighting device of claim 1, wherein the base (20; 20A) further has at least one socket (21; 22; 23) configured for receiving at least one electric bulb (12).

5. The vehicle lighting device of claim 1, wherein the connection terminal (32) comprises at least one blade (33) for cutting an insulation coating (41) of the insulated wire (40).

6. The vehicle lighting device of claim 1, wherein at least one mount base (35) is provided on the base (20; 20A) for mounting the control module (30Rk; 30R; 30D; 30ZD; 50Rk; 50R; 50D; 50ZD).

7. A method of assembling a vehicle lighting device, comprising the following steps:

providing a base (20; 20A) including a socket (21; 22; 23) into which a light emitting element (10; 11) is mountable;

laying at least one insulated wires (40) on the base (20; 20A) to form a specified circuit pattern for connection with the socket (21; 22; 23); and arranging at least one control module (30Rk; 30R; 30D; 30ZD; 50Rk; 50R; 50D; 50ZD) having at least one connection terminal (32) of insulation-displacement type projecting therefrom thereby connecting the control modules (30Rk; 30R; 30D; 30ZD; 50Rk; 50R; 50D; 50ZD) with the insulated wires (40) at specified positions of the insulated wires (40) by insulation displacement by means of the connection terminals (32), thereby forming the lighting circuit.

8. The method of claim 7, further comprising a step of forming the control modules (30Rk; 30R; 30D; 30ZD; 50Rk; 50R; 50D; 50ZD) by resin-molding at least one electronic and/or electric parts (Rk; R; D; ZD) such as a resistor, a diode or the like.

9. The method of claim 7, wherein each control module (30Rk; 30R; 30D; 30ZD; 50Rk; 50R; 50D; 50ZD) has the connection terminal (32) projecting in a mounting direction (MD) from a side surface of a main body (31).

10. The method of claim 7, further comprising providing a socket (21; 22; 23) on the base (20; 20A) for at least one LED (11) or at least one electric bulb (12).

* * * * *